(12) United States Patent
Baptist et al.

(10) Patent No.: US 10,067,832 B2
(45) Date of Patent: *Sep. 4, 2018

(54) IMPOSTER SLICES

(71) Applicant: International Business Machines Corporation, Armonk, NY (US)

(72) Inventors: Andrew D. Baptist, Mt. Pleasant, WI (US); Greg R. Dhuse, Chicago, IL (US); Ravi V. Khadiwala, Bartlett, IL (US); Jason K. Resch, Chicago, IL (US); Ilya Volvovski, Chicago, IL (US); Ethan S. Wozniak, Park Ridge, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 50 days.

This patent is subject to a terminal disclaimer.

(21) Appl. No.: 15/283,241

(22) Filed: Sep. 30, 2016

(65) Prior Publication Data
US 2017/0123909 A1 May 4, 2017

Related U.S. Application Data

(60) Provisional application No. 62/248,752, filed on Oct. 30, 2015.

(51) Int. Cl.
*G11C 29/00* (2006.01)
*G06F 11/10* (2006.01)
(Continued)

(52) U.S. Cl.
CPC .......... *G06F 11/1092* (2013.01); *G06F 3/064* (2013.01); *G06F 3/0604* (2013.01);
(Continued)

(58) Field of Classification Search
CPC .... G06F 11/1092; G06F 3/0619; G06F 3/064; G06F 3/067; G06F 3/0604; G06F 3/0659;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Sam Rizk
(74) *Attorney, Agent, or Firm* — Garlick & Markison; Timothy W. Markison; Harry S. Tyson, Jr.

(57) ABSTRACT

Methods and apparatus for accessing dispersed storage error encoded data in a dispersed storage network (DSN). When storing data in available storage units of a DSN, a DS processing unit issues a write slice request that includes a slice name corresponding to the storage unit and a unique encoded data slice of the set of encoded data slices, where each encoded data slice includes an IDA index of the corresponding storage unit. For each unavailable storage unit, the DS processing unit issues a write imposter slice request to a foster storage unit that includes a slice name corresponding to the foster storage unit and imposter encoded data slice corresponding to the unavailable storage unit, where the imposter encoded data slice includes an IDA index corresponding to the unavailable storage unit.

20 Claims, 11 Drawing Sheets

(51) Int. Cl.
  *G06F 3/06* (2006.01)
  *H03M 13/15* (2006.01)
  *H04L 12/26* (2006.01)
  *H04L 29/08* (2006.01)
  *G06F 11/20* (2006.01)
  *H03M 13/37* (2006.01)

(52) U.S. Cl.
  CPC ............ *G06F 3/067* (2013.01); *G06F 3/0611* (2013.01); *G06F 3/0619* (2013.01); *G06F 3/0659* (2013.01); *G06F 3/0665* (2013.01); *G06F 3/0689* (2013.01); *G06F 11/2094* (2013.01); *H03M 13/1515* (2013.01); *H03M 13/3761* (2013.01); *H04L 43/0864* (2013.01); *H04L 43/16* (2013.01); *H04L 67/1008* (2013.01); *H04L 67/1097* (2013.01); *G06F 2201/805* (2013.01)

(58) Field of Classification Search
  CPC . G06F 3/0665; G06F 3/0689; H03M 13/1515
  See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

IMPOSTER SLICES

CROSS REFERENCE TO RELATED APPLICATIONS

The present U.S. Utility Patent Application claims priority pursuant to 35 U.S.C. § 119(e) to U.S. Provisional Application No. 62/248,752, filed 30 Oct. 2015, entitled "MIGRATING DATA IN A DISPERSED STORAGE NETWORK," which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks, and more particularly to cloud storage.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote storage system. The remote storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE SEVERAL VIEWS OF THE DRAWING(S)

DETAILED DESCRIPTION OF THE INVENTION

Figure 1:
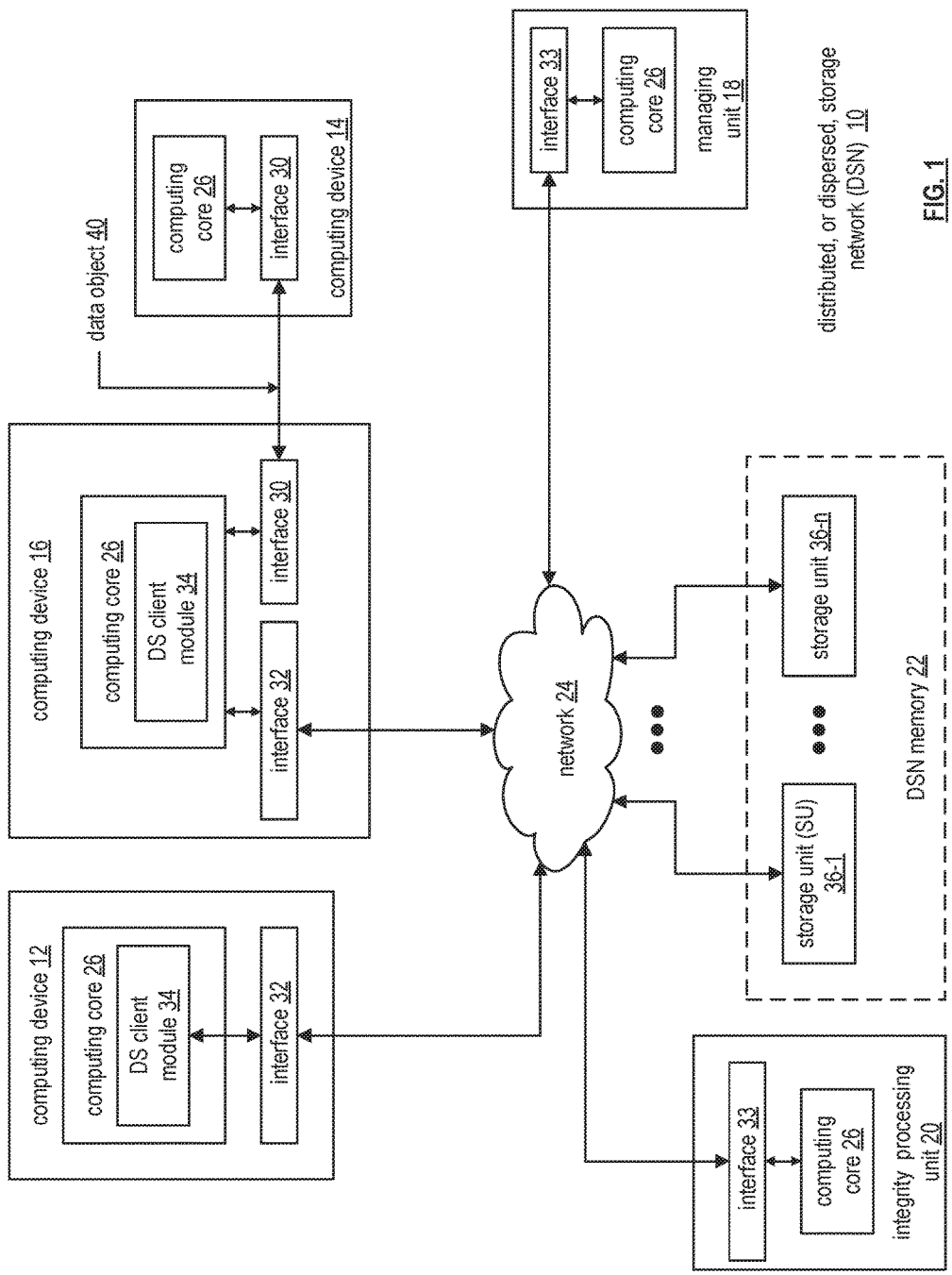
FIG. 1 is a schematic block diagram of an embodiment of a dispersed, or distributed, storage network (DSN) in accordance with the present disclosure.

FIG. 1 is a schematic block diagram of an embodiment of a dispersed, or distributed, storage network (DSN) 10 that includes a plurality of dispersed storage (DS) computing devices or processing units 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

The DSN memory 22 includes a plurality of dispersed storage units 36 (DS units) that may be located at geographically different sites (e.g., one in Chicago, one in Milwaukee, etc.), at a common site, or a combination thereof. For example, if the DSN memory 22 includes eight dispersed storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36.

Each of the DS computing devices 12-16, the managing unit 18, and the integrity processing unit 20 include a computing core 26, and network or communications interfaces 30-33 which can be part of or external to computing core 26. DS computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the dispersed storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-16 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20. The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network operations can further include monitoring read, write and/or delete communications attempts, which attempts could be in the form of requests. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

To support data storage integrity verification within the DSN 10, the integrity processing unit 20 (and/or other devices in the DSN 10 such as managing unit 18) may assess and perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are assessed and checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, managing unit 18, stored on a DS unit 36, and/or distributed among multiple storage units 36.

Figure 2:
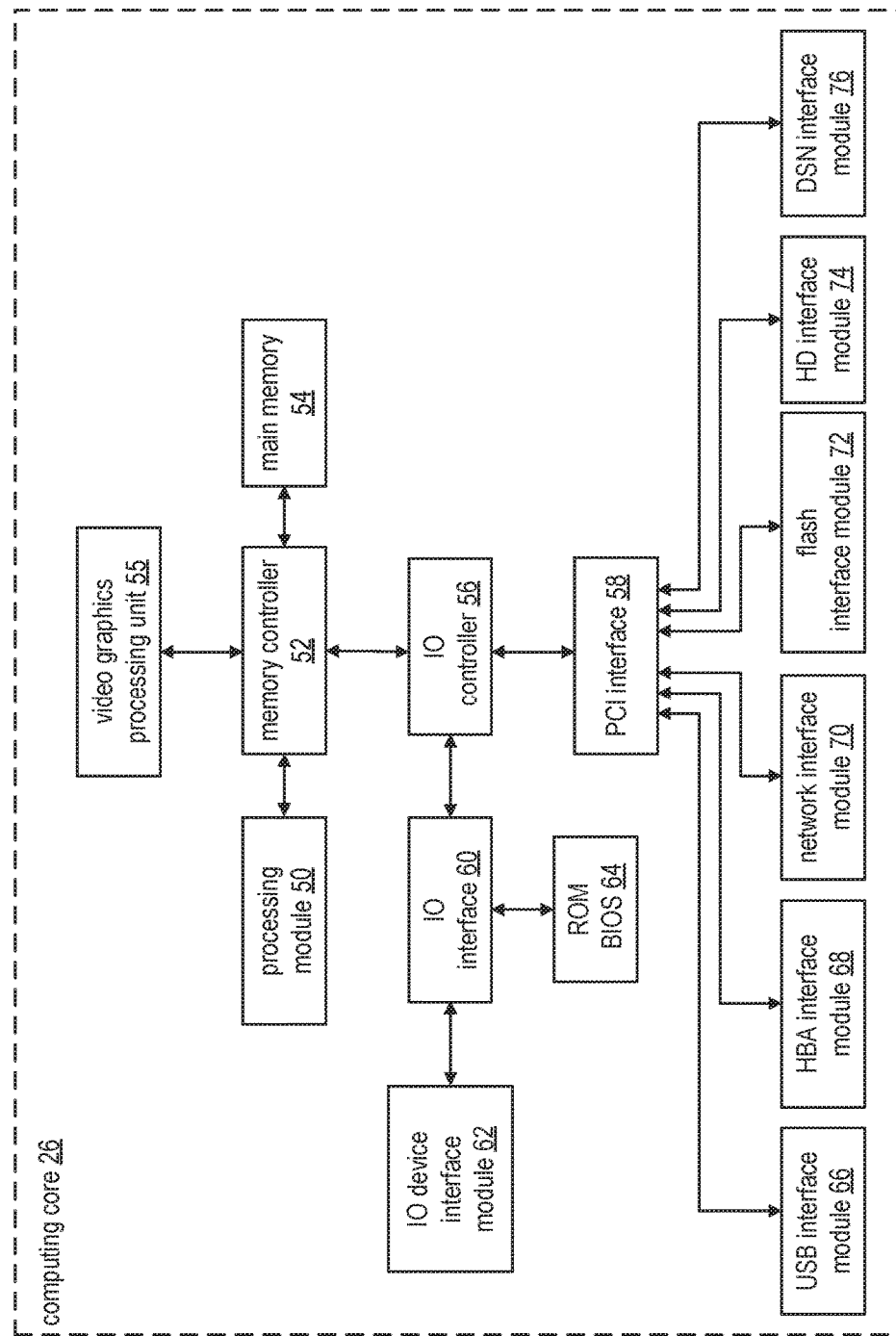
FIG. 2 is a schematic block diagram of an embodiment of a computing core in accordance with the present disclosure.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figure 3:
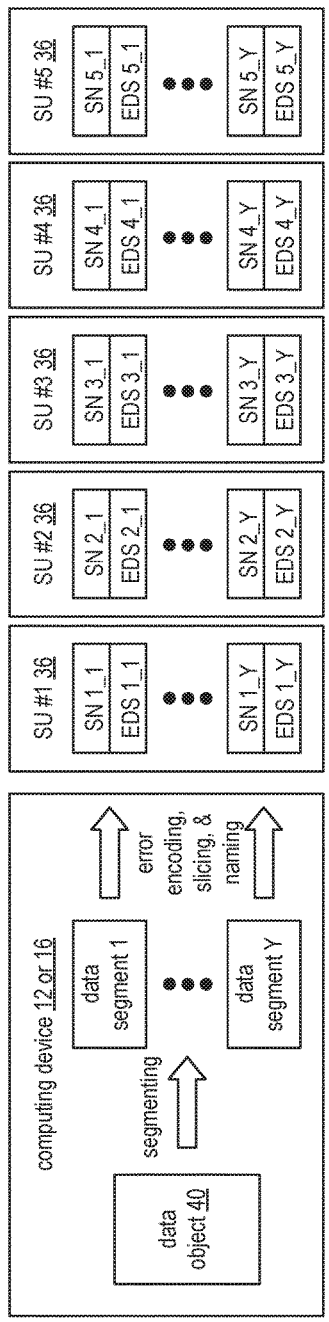
FIG. 3 is a schematic block diagram of an example of dispersed storage error encoding of data in accordance with the present disclosure.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 4:
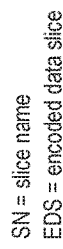
FIG. 4 is a schematic block diagram of a generic example of an error encoding function in accordance with the present disclosure.
Figure 5:
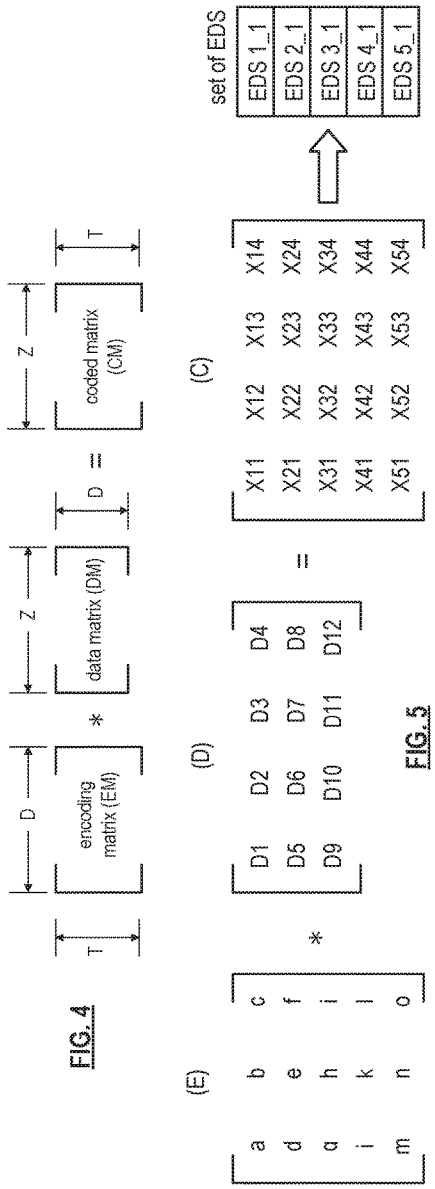
FIG. 5 is a schematic block diagram of a specific example of an error encoding function in accordance with the present disclosure.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value X11=aD1+bD5+cD9, X12=aD2+bD6+cD10, . . . X53=mD3+nD7+oD11, and X54=mD4+nD8+oD12.

Figure 6:
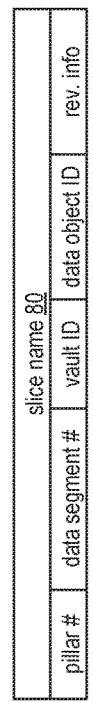
FIG. 6 is a schematic block diagram of an example of slice naming information for an encoded data slice (EDS) in accordance with the present disclosure.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
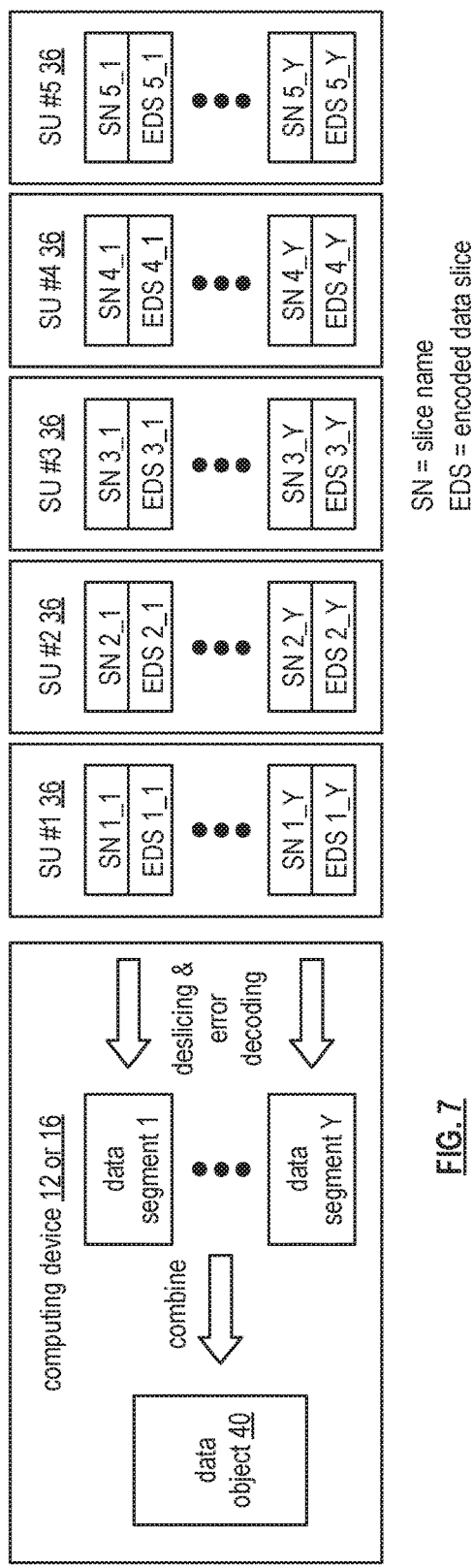
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
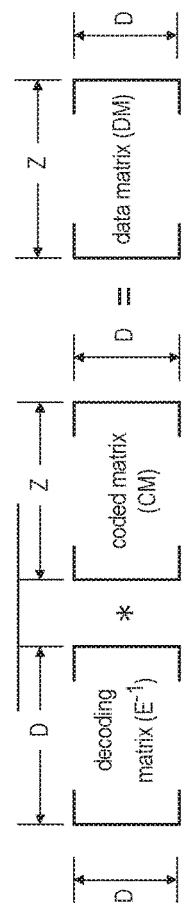
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
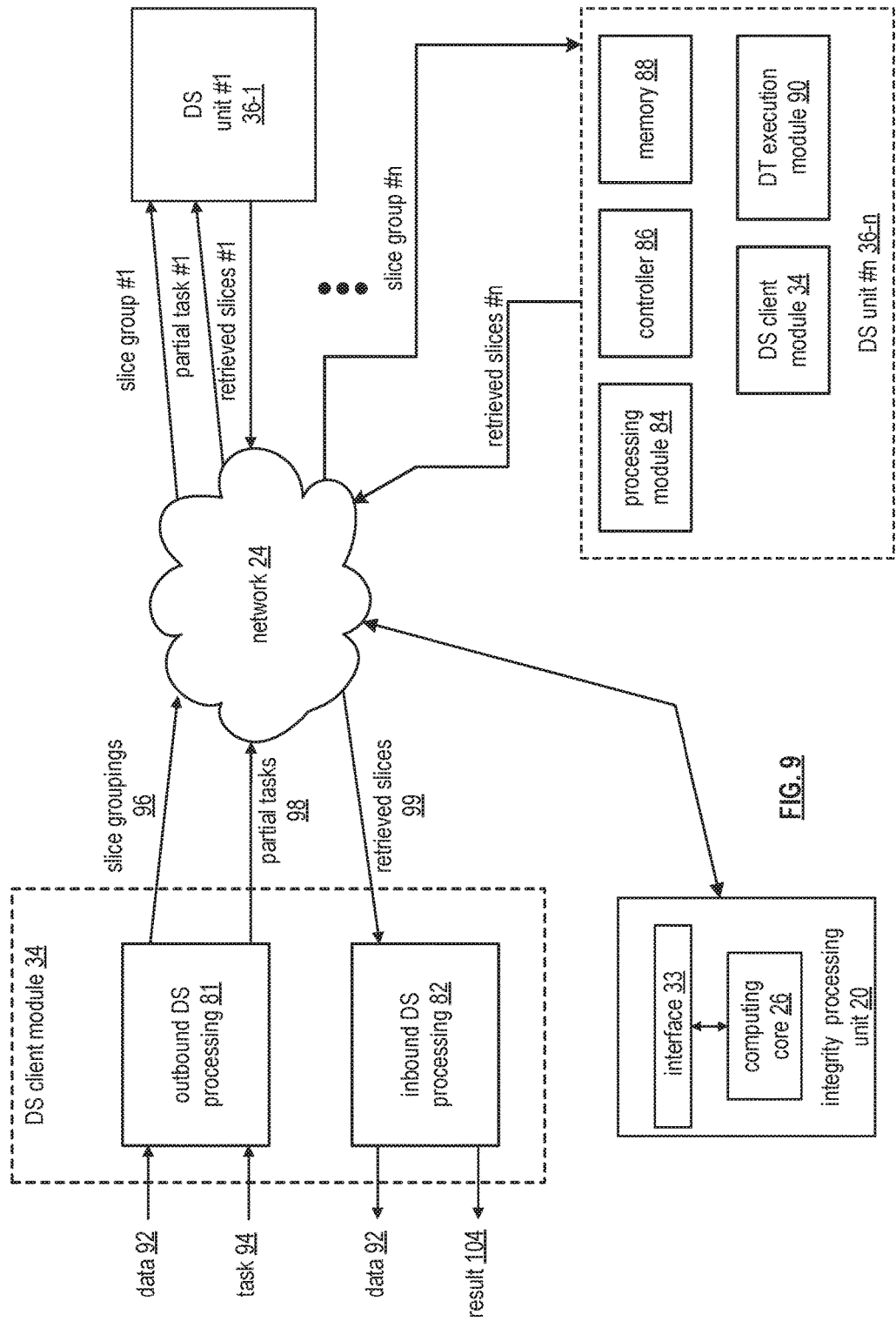
FIG. 9 is a schematic block diagram of an example of a dispersed storage network in accordance with the present disclosure.

FIG. 9 is a diagram of an example of a dispersed storage network. The dispersed storage network includes a DS (dispersed storage) client module 34 (which may be in DS computing devices 12 and/or 16 of FIG. 1), a network 24, and a plurality of DS units 36-1 . . . 36-n (which may be storage units 36 of FIG. 1 and which form at least a portion of DS memory 22 of FIG. 1), a DSN managing unit (not shown—device 18 in FIG. 1), and a DS integrity verification module 20. The DS client module 34 includes an outbound DS processing section 81 and an inbound DS processing section 82. Each of the DS units 36-1 . . . 36-n includes a controller 86, a processing module 84 including a communications interface for communicating over network 24 (not shown), memory 88, a DT (distributed task) execution module 90, and a DS client module 34.

In an example of operation, the DS client module 34 receives data 92. The data 92 may be of any size and of any content, where, due to the size (e.g., greater than a few Terabytes), the content (e.g., secure data, etc.), and/or concerns over security and loss of data, distributed storage of the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DS client module 34, the outbound DS processing section 81 receives the data 92. The outbound DS processing section 81 processes the data 92 to produce slice groupings 96. As an example of such processing, the outbound DS processing section 81 partitions the data 92 into a plurality of data partitions. For each data partition, the outbound DS processing section 81 dispersed storage (DS) error encodes the data partition to produce encoded data slices and groups the encoded data slices into a slice grouping 96.

The outbound DS processing section 81 then sends, via the network 24, the slice groupings 96 to the DS units 36-1 . . . 36-n of the DSN memory 22 of FIG. 1. For example, the outbound DS processing section 81 sends slice group to DS storage unit 36-1. As another example, the outbound DS processing section 81 sends slice group #n to DS unit #n.

In one example of operation, the DS client module 34 requests retrieval of stored data within the memory of the DS units 36. In this example, the task 94 is retrieve data stored in the DSN memory 22. Accordingly, and according to one embodiment, the outbound DS processing section 81 converts the task 94 into a plurality of partial tasks 98 and sends the partial tasks 98 to the respective DS storage units 36-1 . . . 36-n.

In response to the partial task 98 of retrieving stored data, a DS storage unit 36 identifies the corresponding encoded data slices 99 and retrieves them. For example, DS unit #1 receives partial task #1 and retrieves, in response thereto, retrieved slices #1. The DS units 36 send their respective retrieved slices 99 to the inbound DS processing section 82 via the network 24.

The inbound DS processing section 82 converts the retrieved slices 99 into data 92. For example, the inbound DS processing section 82 de-groups the retrieved slices 99 to produce encoded slices per data partition. The inbound DS processing section 82 then DS error decodes the encoded slices per data partition to produce data partitions. The inbound DS processing section 82 de-partitions the data partitions to recapture the data 92.

Figure 10A:
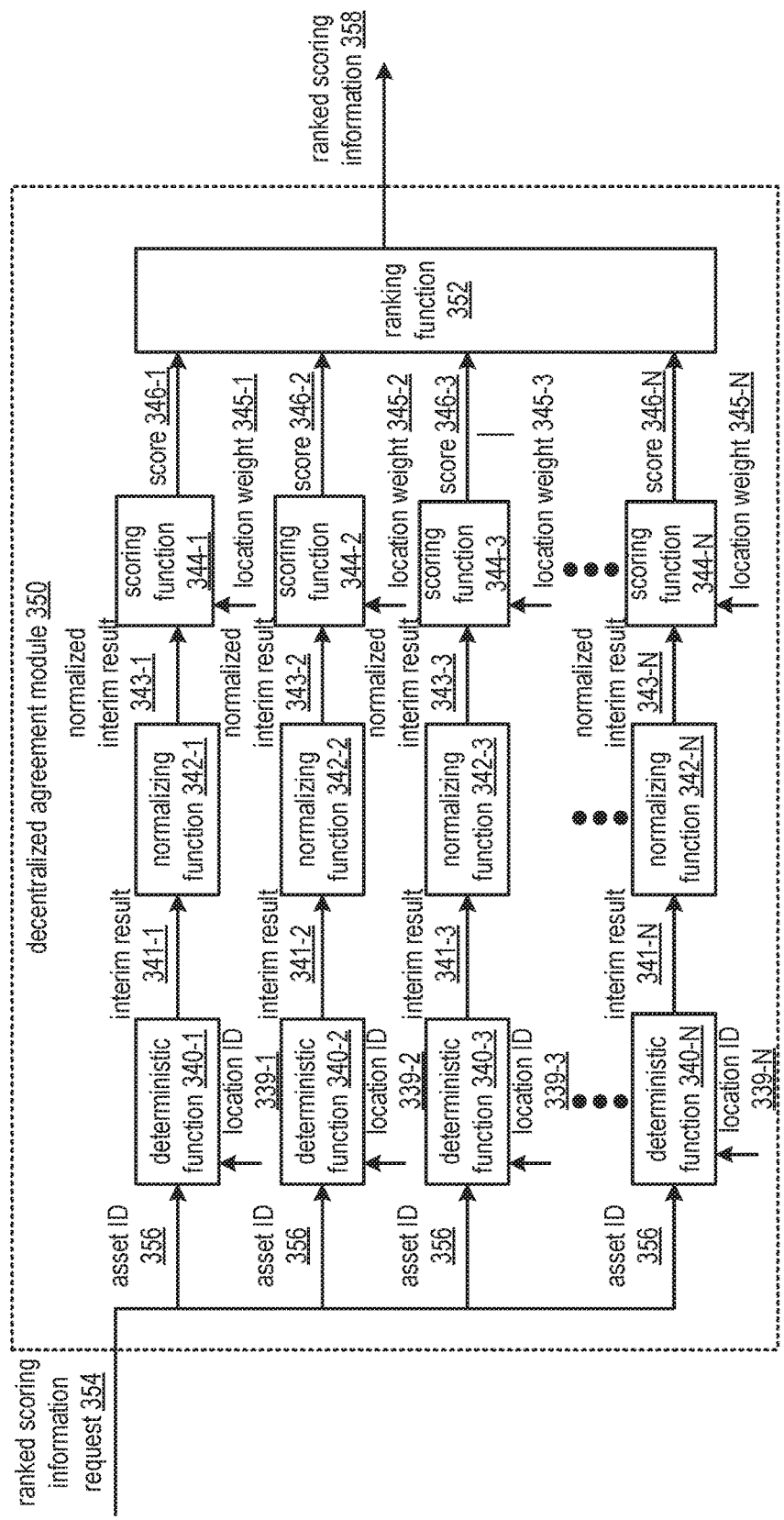
FIG. 10A is a schematic block diagram of an embodiment of a decentralized agreement module in accordance with the present invention.

FIG. 10A is a schematic block diagram of an embodiment of a decentralized agreement module 350 that includes a set of deterministic functions 340-1 . . . 340-N, a set of normalizing functions 342-1 . . . 342-N, a set of scoring functions 344-1 . . . 344-N, and a ranking function 352. Each of the deterministic function, the normalizing function, the scoring function, and the ranking function 352, may be implemented utilizing the processing module 84 of FIG. 9. The decentralized agreement module 350 may be implemented utilizing any module and/or unit of a dispersed storage network (DSN). For example, the decentralized agreement module is implemented utilizing the distributed storage (DS) client module 34 of FIG. 1.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations include one or more of a storage unit, a memory device of the storage unit, a site, a storage pool of storage units, a pillar index associated with each encoded data slice of a set of encoded data slices generated by an information dispersal algorithm (IDA), a DS client module 34 of FIG. 1, a dispersed storage (DS) processing unit (computing device) 16 of FIG. 1, a DS integrity processing unit 20 of FIG. 1, a DSN managing unit 18 of FIG. 1, a user device (computing device) 12 of FIG. 1, and a user device (computing device) 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result 341-1 . . . 341-N. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 340-2 appends a location ID 339-2 of a storage pool to a source name as the asset ID to produce a combined value and performs the mask generating function on the combined value to produce interim result 341-2.

With a set of interim results 341-1 . . . 341-N, each normalizing function 342-1 . . . 342N performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 342-2 performs the normalizing function on the interim result 341-2 to produce a normalized interim result 343-2.

With a set of normalized interim results 343-1 . . . 343-N, each scoring function performs a scoring function on a corresponding normalized interim result to produce a corresponding score. The performing of the scoring function includes dividing an associated location weight by a negative log of the normalized interim result. For example, scoring function 344-2 divides location weight 345-2 of the storage pool (e.g., associated with location ID 339-2) by a negative log of the normalized interim result 343-2 to produce a score 346-2.

With a set of scores 346-1 . . . 346-N, the ranking function 352 performs a ranking function on the set of scores 346-1 . . . 346-N to generate the ranked scoring information 358. The ranking function includes rank ordering each score with other scores of the set of scores 346-1 . . . 346-N, where a highest score is ranked first. As such, a location associated with the highest score may be considered a highest priority location for resource utilization (e.g., accessing, storing, retrieving, etc., the given asset of the request). Having generated the ranked scoring information 358, the decentralized agreement module 350 outputs the ranked scoring information 358 to the requesting entity.

Figure 10B:
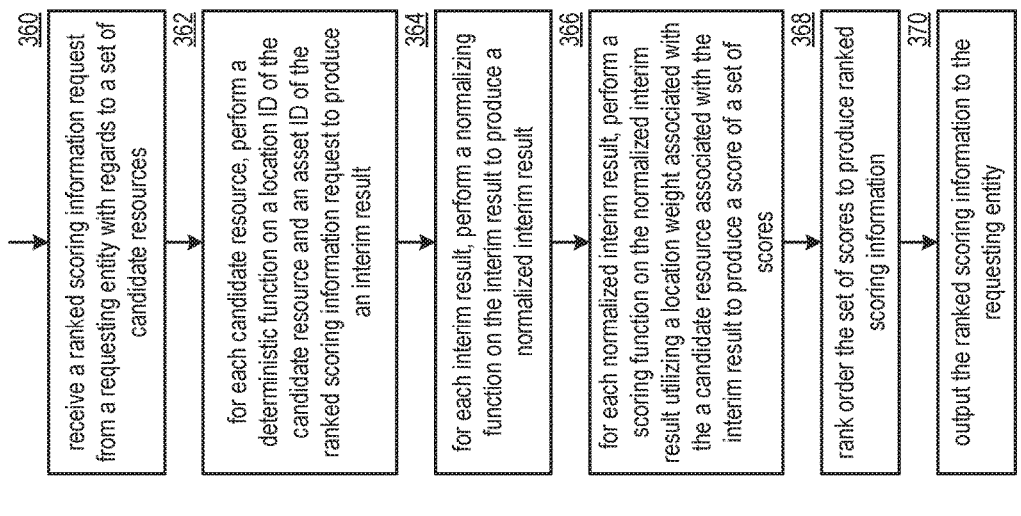
FIG. 10B is a flowchart illustrating an example of selecting the resource in accordance with the present invention.

FIG. 10B is a flowchart illustrating an example of selecting a resource. The method begins or continues at step 360 where a processing module (e.g., of a decentralized agreement module) receives a ranked scoring information request from a requesting entity with regards to a set of candidate resources. For each candidate resource, the method continues at step 362 where the processing module performs a deterministic function on a location identifier (ID) of the candidate resource and an asset ID of the ranked scoring information request to produce an interim result. As a specific example, the processing module combines the asset ID and the location ID of the candidate resource to produce a combined value and performs a hashing function on the combined value to produce the interim result.

For each interim result, the method continues at step 364 where the processing module performs a normalizing function on the interim result to produce a normalized interim result. As a specific example, the processing module obtains a permutation value associated with the deterministic function (e.g., maximum number of permutations of output of the deterministic function) and divides the interim result by the permutation value to produce the normalized interim result (e.g., with a value between 0 and 1).

For each normalized interim result, the method continues at step 366 where the processing module performs a scoring function on the normalized interim result utilizing a location weight associated with the candidate resource associated with the interim result to produce a score of a set of scores. As a specific example, the processing module divides the location weight by a negative log of the normalized interim result to produce the score.

The method continues at step 368 where the processing module rank orders the set of scores to produce ranked scoring information (e.g., ranking a highest value first). The method continues at step 370 where the processing module outputs the ranked scoring information to the requesting entity. The requesting entity may utilize the ranked scoring information to select one location of a plurality of locations.

Figure 10C:
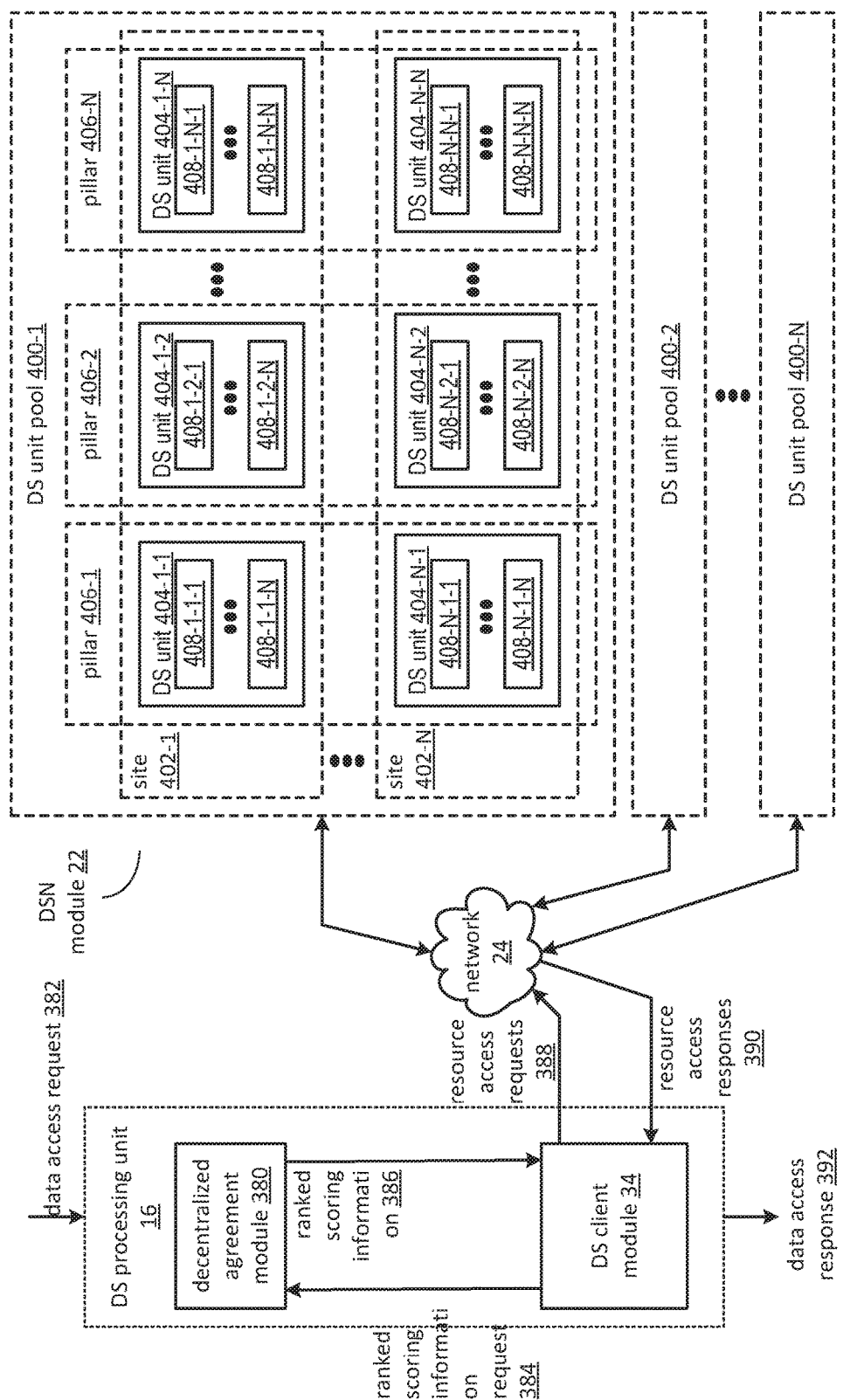
FIG. 10C is a schematic block diagram of an embodiment of a dispersed storage network (DSN) in accordance with the present invention.

FIG. 10C is a schematic block diagram of an embodiment of a dispersed storage network (DSN) that includes the distributed storage (DS) processing unit (computing device) 16 of FIG. 1, the network 24 of FIG. 1, and the distributed storage network (DSN) module 22 of FIG. 1. Hereafter, the DSN module 22 may be interchangeably referred to as a DSN memory. The DS processing unit 16 includes a decentralized agreement module 380 and the DS client module 34 of FIG. 1. The decentralized agreement module 380 being implemented utilizing the decentralized agreement module 350 of FIG. 10A. The DSN module 22 includes a plurality of DS unit pools 400-1 . . . 400-N. Each DS unit pool includes one or more sites 402-1 . . . 402-N. Each site includes one or more DS units 404-1-1 . . . 404-1-N. Each DS unit may be associated with at least one pillar of N pillars associated with an information dispersal algorithm (IDA) (406-1 . . . 406-N), where a data segment is dispersed storage error encoded using the IDA to produce one or more sets of encoded data slices, and where each set includes N encoded data slices and like encoded data slices (e.g., slice 3's) of two or more sets of encoded data slices are included in a common pillar (e.g., pillar 406-3). Each site may not include every pillar and a given pillar may be implemented at more than one site. Each DS unit includes a plurality of memories (e.g. DS unit 404-1-1 includes memories 408-1-1-1 . . . 408-1-1-N. Each DS unit may be implemented utilizing the DS unit 36 of FIG. 1 and the memories 408 of DS units can be implemented utilizing memory 88 of DS unit 36 in FIG. 9. Hereafter, a DS unit may be referred to interchangeably as a storage unit and a set of DS units may be interchangeably referred to as a set of storage units and/or as a storage unit set.

The DSN functions to receive data access requests 382, select resources of at least one DS unit pool for data access, utilize the selected DS unit pool for the data access, and issue a data access response 392 based on the data access. The selecting of the resources includes utilizing a decentralized agreement function of the decentralized agreement module 380, where a plurality of locations are ranked against each other. The selecting may include selecting one storage pool of the plurality of storage pools, selecting DS units at various sites of the plurality of sites, selecting a memory of the plurality of memories for each DS unit, and selecting combinations of memories, DS units, sites, pillars, and storage pools.

In an example of operation, the DS client module 34 receives the data access request 382 from a requesting entity, where the data access request 382 includes at least one of a store data request, a retrieve data request, a delete data request, a data name, and a requesting entity identifier (ID). Having received the data access request 382, the DS client module 34 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory, from a dispersed hierarchical index) based on the data name (e.g., for the retrieve data request).

Having determined the DSN address, the DS client module 34 selects a plurality of resource levels (e.g., DS unit pool, site, DS unit, pillar, memory) associated with the DSN module 22. The determining may be based on one or more of the data name, the requesting entity ID, a predetermination, a lookup, a DSN performance indicator, and interpreting an error message. For example, the DS client module 34 selects the DS unit pool as a first resource level and a set of memory devices of a plurality of memory devices as a second resource level based on a system registry lookup for a vault associated with the requesting entity.

Having selected the plurality of resource levels, the DS client module 34, for each resource level, issues a ranked scoring information request 384 to the decentralized agreement module 380 utilizing the DSN address as an asset ID. The decentralized agreement module 380 performs the decentralized agreement function based on the asset ID (e.g., the DSN address), identifiers of locations of the selected resource levels, and location weights of the locations to generate ranked scoring information 386.

For each resource level, the DS client module 34 receives corresponding ranked scoring information 386. Having received the ranked scoring information 386, the DS client module 34 identifies one or more resources associated with the resource level based on the rank scoring information 386. For example, the DS client module 34 identifies a DS unit pool associated with a highest score and identifies a set of memory devices within DS units of the identified DS unit pool with a highest score.

Having identified the one or more resources, the DS client module 34 accesses the DSN module 22 based on the identified one or more resources associated with each resource level. For example, the DS client module 34 issues resource access requests 388 (e.g., write slice requests when storing data, read slice requests when recovering data) to the identified DS unit pool, where the resource access requests 388 further identify the identified set of memory devices. Having accessed the DSN module 22, the DS client module 34 receives resource access responses 390 (e.g., write slice responses, read slice responses). The DS client module 34 issues the data access response 392 based on the received resource access responses 390. For example, the DS client module 34 decodes received encoded data slices to reproduce data and generates the data access response 392 to include the reproduced data.

Figure 10D:
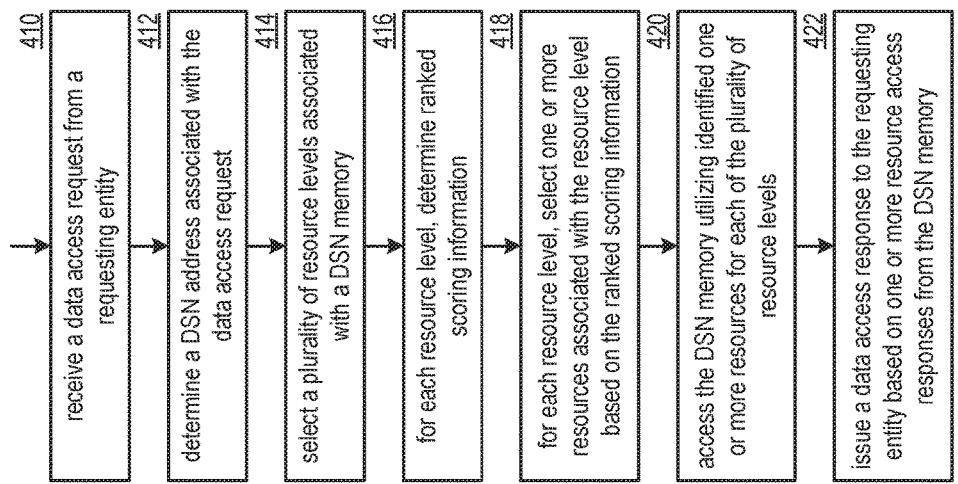
FIG. 10D is a flowchart illustrating an example of accessing a dispersed storage network (DSN) memory in accordance with the present invention.

FIG. 10D is a flowchart illustrating an example of accessing a dispersed storage network (DSN) memory. The method begins or continues at step 410 where a processing module (e.g., of a distributed storage (DS) client module) receives a data access request from a requesting entity. The data access request includes one or more of a storage request, a retrieval request, a requesting entity identifier, and a data identifier (ID). The method continues at step 412 where the processing module determines a DSN address associated with the data access request. For example, the processing module generates the DSN address for the storage request. As another example, the processing module performs a lookup for the retrieval request based on the data identifier.

The method continues at step 414 where the processing module selects a plurality of resource levels associated with the DSN memory. The selecting may be based on one or more of a predetermination, a range of weights associated with available resources, a resource performance level, and a resource performance requirement level. For each resource level, the method continues at step 416 where the processing module determines ranked scoring information. For example, the processing module issues a ranked scoring information request to a decentralized agreement module based on the DSN address and receives corresponding ranked scoring information for the resource level, where the decentralized agreement module performs a decentralized agreement protocol function on the DSN address using the associated resource identifiers and resource weights for the resource level to produce the ranked scoring information for the resource level.

For each resource level, the method continues at step 418 where the processing module selects one or more resources associated with the resource level based on the ranked scoring information. For example, the processing module selects a resource associated with a highest score when one resource is required. As another example, the processing module selects a plurality of resources associated with highest scores when a plurality of resources are required.

The method continues at step 420 where the processing module accesses the DSN memory utilizing the selected one or more resources for each of the plurality of resource levels. For example, the processing module identifies network addressing information based on the selected resources including one or more of a storage unit Internet protocol address and a memory device identifier, generates a set of encoded data slice access requests based on the data access request and the DSN address, and sends the set of encoded data slice access requests to the DSN memory utilizing the identified network addressing information.

The method continues at step 422 where the processing module issues a data access response to the requesting entity based on one or more resource access responses from the DSN memory. For example, the processing module issues a data storage status indicator when storing data. As another example, the processing module generates the data access response to include recovered data when retrieving data.

In one example of operation, the DSN of FIG. 1 is used to store and retrieve encoded data slices when a DS unit is unavailable using imposter slices.

In a DSN memory 22, which can include DS units 36-1 . . . 36-n as shown in FIG. 1, the name of the slice may encode which IDA index (or pillar) the slice is associated with, and accordingly the name of the slice determines not only where the slice belongs (by the namespace or other mechanism) but also how it should be used when decoded. Using the name for these two functions can limit flexibility in certain scenarios. A DSN memory using a more flexible strategy will use the name for only one of these functions, such as determining where it belongs, and will use another mechanism, such as embedding the IDA index information together with the slice data itself. In normal situations, there may be agreement between the name of the slice and the actual pillar the slice represents from the encoding operation. However, when there is disagreement between them, such slices are considered "imposter slices", as they have the name corresponding to one pillar, but their actual slice content is representative of a different pillar. Supporting imposter slices offers numerous benefits to several foster slice strategies, such as Trimmed Writes. When a DS processing unit (computing device of FIG. 1) is unable to write slices to their primary (default/home) locations, it may instead have to write additional slices to other DS units. The process of restoring affinity (moving restoring slices on the primary locations and removing them from the secondary locations) normally requires rebuilding in a Trimmed Writes case, since the slices written to the secondary locations are in different pillars than those slices that would have been written to the primary locations. However, when using imposter slices, no rebuilding is required. Instead, the slice may be "renamed" to a name corresponding to the slice that would have been written to the primary location, and then it is sent directly (from the secondary location to the primary location) without requiring a rebuild. When a DS processing unit reads an imposter slice, it determines that it has a mismatched pillar between the slice name and the slice content by inspecting an indicator within the slice content (e.g. a header and/or footer which contains a field for the actual pillar), it then sets up an appropriate IDA decoding matrix for the set of slices accordingly and then decodes as normal. Further explanations of these processes of using imposter slices are set out below in conjunction with FIGS. 11A and 11B.

Figure 11A:
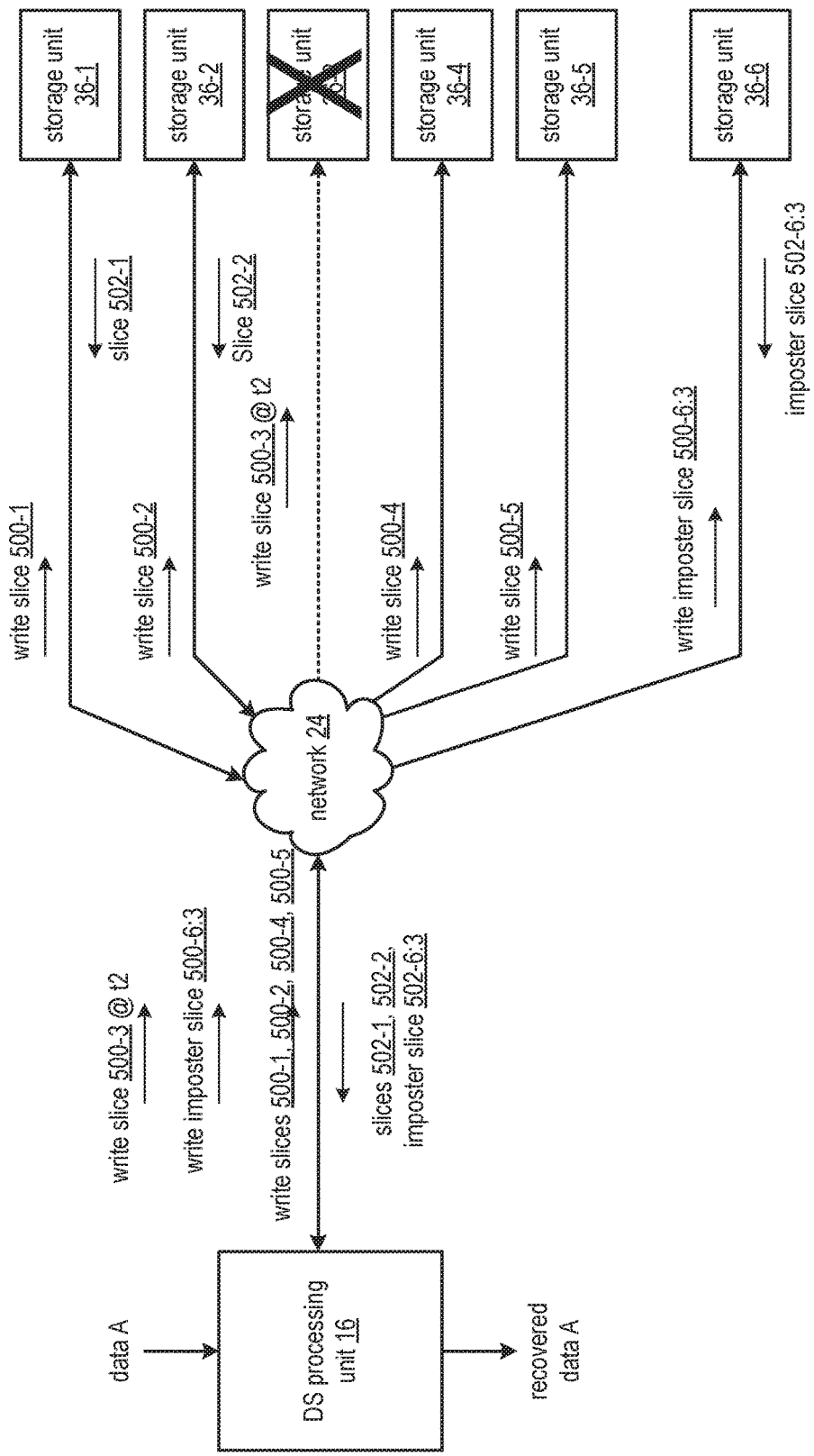
FIG. 11A is a schematic block diagram of another embodiment of a dispersed storage network (DSN) in accordance with the present invention.

FIG. 11A is a schematic block diagram of another embodiment of a dispersed storage network (DSN) that includes the distributed storage processing unit (computing device) 16 of FIG. 1, the network 24 of FIG. 1, and a plurality of storage units 36-1 . . . 36-6. Each storage unit may be implemented utilizing the DS unit 36 of FIG. 1. The DSN functions to access data stored in the plurality of storage units. The accessing includes storing the data and retrieving stored data to produce recover data.

In an example of operation of the accessing of the data, when the accessing includes the storing of the data, the DS processing unit 16 dispersed storage error encodes a data segment of data A to produce a set of encoded data slices. For each available storage unit of a set of storage units of the plurality of storage units, the DS processing unit 16 issues a write slice request that includes a slice name corresponding to the storage unit and a unique encoded data slice of the set of encoded data slices, where each encoded data slice includes an IDA index of a corresponding storage unit. For example, the DST processing unit 16 generates write slice requests 500-1, 500-2, 500-4, 500-5 to include respective slice names, and respective encoded data slices that are respectively embedded with respective IDA indexes, and sends, via the network 24, the write slice requests 500-1, 500-2, 500-4, 500-5, to the storage unit 36-1, 36-2, 36-4, and 36-5, to facilitate storage of the respective encoded data slices, in the storage units 36-1, 36-2, 36-4, 36-5 when the set of storage units includes storage units 36-1 to 36-5 and storage unit 36-3 is unavailable.

For each unavailable storage unit of the set of storage units, the DS processing unit 16 issues a write imposter slice request to a foster storage unit that includes a slice name corresponding to the foster storage unit and imposter encoded data slice corresponding to the unavailable storage unit, where the imposter encoded data slice includes an IDA index corresponding to the unavailable storage unit. For example, the DS processing unit 16 issues, via the network 24, a write imposter slice request 500-6:3 (e.g., that includes a slice name corresponding to DS unit 36-6, but an encoded data slice that includes an IDA index corresponding to DS unit 36-3) to the storage unit 36-6 when the storage unit 36-6 is utilized as the foster storage unit and the storage unit 36-3 is the unavailable storage unit.

When the accessing includes the retrieving of the store data to produce the recovered data, the DS processing unit 16 retrieves the decode threshold number of unique slices (e.g., encoded data slices and/or imposter encoded data slices), interprets the retrieved slices to identify IDA indexes, dispersed storage error decodes the retrieved decode threshold number of unique slices based on the identified IDA indexes (e.g., arranges a decoding matrix based on the IDA indexes, matrix multiplies the decoding matrix by the retrieved slices) to produce the recovered data. For example, the DS processing unit 16 retrieves two encoded data slices 502-1 and 502-2 from DS units 36-1, and 36-2 respectively, and imposter slice 502-6:3 from DS unit 36-6, and dispersed storage error decodes the retrieved slices to reproduce the data segment to produce the recovered data A when a decode threshold value of the dispersed storage error decoding is 3.

When an unavailable storage unit becomes available, the DS processing unit 16 retrieves a corresponding imposter encoded data slice from a corresponding foster storage unit and issues a write slice requests to the available storage unit, where the write slice request includes a slice name associated with the available storage unit and imposter encoded data slice. For example, the DS processing unit 16 detects that the storage unit 3 is now available, retrieves, via the network 24, imposter slice 502-6:3 from the storage unit 6, generates a write slice request 500-3 to include the corresponding encoded data slice and a slice name number for DS unit 36-3, and sends, at a second timeframe t2 subsequent to detection of the availability of storage unit 36-3, the write slice request 500-3 to the storage unit 36-3 to facilitate storage of the encoded data slice in the storage unit 36-3. Though described above in the context of computing device 16, this function may be implemented utilizing any module and/or unit of a dispersed storage network (DSN) including the DS Managing Unit 18, the Integrity Processing Unit 20, and/or by one or more DS units 36-1 . . . 36-n shown in FIG. 1.

Figure 11B:
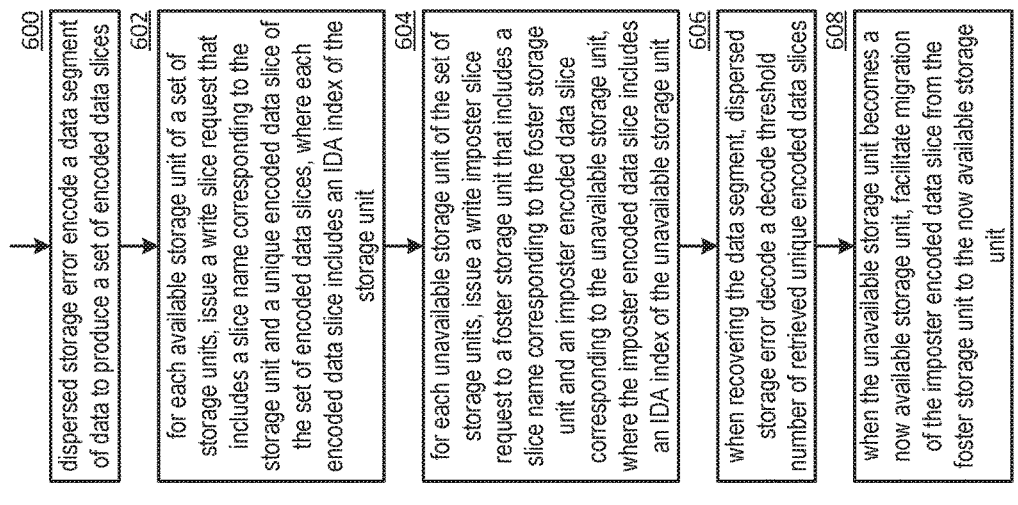
FIG. 11B is a flowchart illustrating an example of accessing data in accordance with the present invention.

FIG. 11B is a flowchart illustrating an example of accessing data. The method includes a step 600 where a processing module of one or more processing modules of one or more computing devices of a dispersed storage network (DSN) (e.g., of a distributed storage (DS) processing unit) dispersed storage error encodes a data segment of data to produce a set of encoded data slices. For each unavailable storage unit of a set of storage units, the method continues at the step 602 where the processing module issues a write slice request that includes a slice name corresponding to the storage unit and a unique encoded data slice of the set of encoded data slices, where each encoded data slice includes an information dispersal algorithm (IDA) index of the storage unit. For example, the processing module generates a write slice request to include a slice name and an encoded data slice embedded with an IDA index, and sends the write slice request to a storage unit of the set of storage units.

For each unavailable storage unit of the set of storage units, the method continues at the step 604 where the processing module issues a write imposter slice request to a foster storage unit that includes a slice name corresponding to the foster storage unit and an imposter encoded data slice corresponding to the unavailable storage unit, where the imposter encoded data slice includes an IDA index of the unavailable storage unit. For example, the processing module generates the write imposter slice request to include a slice name corresponding to the foster storage unit and an encoded data slice corresponding to the unavailable storage unit embedded with an IDA index corresponding to the unavailable storage unit, and sends the write imposter slice request to foster storage unit for storage of the encoded data slice corresponding to the unavailable storage unit.

When recovering the data segment, the method continues at the step 606 where the processing module disperse storage error decodes a decode threshold number of retrieved unique encoded data slices. For example, the processing module receives a decode threshold number of unique slices (e.g., encoded data slices and/or imposter encoded data slices), interprets the received slices to identify IDA indexes, and dispersed storage error decodes the retrieved decode threshold number of unique slices based on the identified IDA indexes to produce recovered data.

When the unavailable storage unit becomes a now available storage unit, the method continues at the step 608 where the processing module facilitates migration of the imposter encoded data slice from the foster storage unit to the now available storage unit. For example, the processing module detects availability of the formerly unavailable storage unit, retrieves the imposter encoded data slice from the foster storage unit, issues a write slice request to the now available storage unit, where the write slice request includes the slice name associated with the now available storage unit and the imposter encoded data slice that includes the encoded data slice corresponding to the now available storage unit, where the encoded data slice is embedded with the IDA index corresponding to the now available storage unit.

The methods described above in conjunction with the computing device and the storage units can alternatively be performed by other modules of the dispersed storage network or by other devices. For example, any combination of a first module, a second module, a third module, a fourth module, etc. of the computing device and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal A has a greater magnitude than signal B, a favorable comparison may be achieved when the magnitude of signal A is greater than that of signal B or when the magnitude of signal B is less than that of signal A. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information. A computer readable memory/storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method of accessing data in a dispersed storage network, the dispersed storage network including a plurality of dispersed storage units, the method comprising:
    dispersed storage error encoding a data segment to produce a set of encoded data slices;
    sending a first slice write request for receipt by a first dispersed storage unit of the plurality of dispersed storage units, the first slice write request including a first slice name corresponding to the first dispersed storage unit and a first data slice of the set of encoded data slices, wherein the first data slice includes a first information dispersed algorithm index of the first dispersed storage unit; and
    sending a second slice write request for receipt by a third dispersed storage unit of the plurality of dispersed storage units when a second dispersed storage unit of the plurality of dispersed storage units is unavailable, the second slice write request including a second slice name corresponding to the third dispersed storage unit and a second data slice of the set of encoded data slices, wherein the second data slice includes a second information dispersed algorithm index of the second dispersed storage unit.

2. The method of claim 1, wherein the first information dispersed algorithm index of the first dispersed storage unit is included in one or more of a header or footer in the first data slice.

3. The method of claim 1, wherein the second information dispersed algorithm index of the second dispersed storage unit is included in one or more of a header or a footer in the second data slice.

4. The method of claim 1, wherein the first information dispersed algorithm index represents a first pillar the first data slice is associated with.

5. The method of claim 1, wherein the second information dispersed algorithm index represents a second pillar the second data slice is associated with.

6. The method of claim 1, further including retrieving the first data slice and the second data slice.

7. The method of claim 6, further including retrieving additional encoded data slices from the plurality of disperse storage units such that a decode threshold number of unique slices is retrieved and disperse storage error decoding the first data slice, the second data slice and the additional encoded data slices.

8. The method of claim 1, further including retrieving the second data slice when the second dispersed storage unit of the plurality of disperse storage units becomes available and sending a third slice write request for receipt by the second dispersed storage unit of the plurality of dispersed storage units, the third slice write request including a third slice name corresponding to the second dispersed storage unit and the second data slice of the set of encoded data slices, wherein the second data slice includes the information dispersed algorithm index of the second dispersed storage unit.

9. A dispersed storage processing unit for use in a dispersed storage network, the dispersed storage network including a plurality of dispersed storage units, the dispersed storage processing unit comprising:
    a communications interface;
    a memory; and
    a processor;
    wherein the memory includes a data segment and wherein the memory further includes instructions for causing the processor to:
        dispersed storage error encode the data segment to produce a set of encoded data slices;
        send a first slice write request for receipt by a first dispersed storage unit of the plurality of dispersed storage units, the first slice write request including a first slice name corresponding to the first dispersed storage unit and a first data slice of the set of encoded data slices, wherein the first data slice includes a first information dispersed algorithm index of the first dispersed storage unit; and
        send a second slice write request for receipt by a third dispersed storage unit of the plurality of dispersed storage units when a second dispersed storage unit of the plurality of dispersed storage units is unavailable, the second slice write request including a second slice name corresponding to the third dispersed storage unit and a second data slice of the set of encoded data slices, wherein the second data slice includes a second information dispersed algorithm index of the second dispersed storage unit.

10. The dispersed storage processing unit of claim 9, wherein the first information dispersed algorithm index of the first dispersed storage unit is included in one or more of a header or footer in the first data slice.

11. The dispersed storage processing unit of claim 9, wherein the second information dispersed algorithm index of the second dispersed storage unit is included in one or more of a header or a footer in the second data slice.

12. The dispersed storage processing unit of claim 9, wherein the first information dispersed algorithm index represents a first pillar the first data slice is associated with.

13. The dispersed storage processing unit of claim 9, wherein the second information dispersed algorithm index represents a second pillar the second data slice is associated with.

14. The dispersed storage processing unit of claim 9, wherein the memory further includes instructions for causing the processor to retrieve the first data slice and the second data slice.

15. The dispersed storage processing unit of claim 14, wherein the memory further includes instructions for causing the processor to retrieve additional encoded data slices from the plurality of disperse storage units such that a decode threshold number of unique slices is retrieved and disperse storage error decode the first data slice, the second data slice and the additional encoded data slices.

16. The dispersed storage processing unit of claim 9, wherein the memory further includes instructions for causing the processor to retrieve the second data slice when the second dispersed storage unit of the plurality of disperse storage units becomes available and send a third slice write request for receipt by the second dispersed storage unit of the plurality of dispersed storage units, the third slice write request including a third slice name corresponding to the second dispersed storage unit and the second data slice of the set of encoded data slices, wherein the second data slice includes the information dispersed algorithm index of the second dispersed storage unit.

17. A dispersed storage network comprising:
   a plurality of dispersed storage units including a first dispersed storage unit, a second dispersed storage unit and a third dispersed storage unit; and
   a dispersed storage processing unit, the dispersed storage processing unit including:
      a communications interface;
      a memory; and
      a processor;
      wherein the memory includes a data segment and wherein the memory further includes instructions for causing the processor to:
         dispersed storage error encode the data segment to produce a set of encoded data slices;
         send a first slice write request to the first dispersed storage unit of the plurality of dispersed storage units, the first slice write request including a first slice name corresponding to the first dispersed storage unit and a first data slice of the set of encoded data slices, wherein the first data slice includes a first information dispersed algorithm index of the first dispersed storage unit; and
         send a second slice write request to the third dispersed storage unit of the plurality of dispersed storage units when the second dispersed storage unit of the plurality of dispersed storage units is unavailable, the second slice write request including a second slice name corresponding to the third dispersed storage unit and a second data slice of the set of encoded data slices, wherein the second data slice includes a second information dispersed algorithm index of the second dispersed storage unit.

18. The dispersed storage network of claim 17, wherein the memory further includes instructions for causing the processor to retrieve the first data slice and the second data slice.

19. The dispersed storage network of claim 18, wherein the memory further includes instructions for causing the processor to retrieve additional encoded data slices from the plurality of disperse storage units such that a decode threshold number of unique slices is retrieved and disperse storage error decode the first data slice, the second data slice and the additional encoded data slices.

20. The dispersed storage network of claim 17, wherein the memory further includes instructions for causing the processor to retrieve the second data slice when the second dispersed storage unit of the plurality of disperse storage units becomes available and send a third slice write request for receipt by the second dispersed storage unit of the plurality of dispersed storage units, the third slice write request including a third slice name corresponding to the second dispersed storage unit and the second data slice of the set of encoded data slices, wherein the second data slice includes the information dispersed algorithm index of the second dispersed storage unit.

* * * * *